United States Patent
Zhang et al.

(10) Patent No.: US 10,021,800 B1
(45) Date of Patent: Jul. 10, 2018

(54) VENTING FEATURES OF A PORTABLE ELECTRONIC DEVICE

(71) Applicant: Apple Inc., Cupertino, CA (US)

(72) Inventors: Yaocheng Zhang, Cupertino, CA (US);
Kevin M. Froese, San Francisco, CA (US); Scott A. Myers, Saratoga, CA (US); Benjamin J. Pope, Mountain View, CA (US); David A. Hurrell, San Mateo, CA (US); Salome Bavetta, Sunnyvale, CA (US); Eric N. Nyland, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/470,842

(22) Filed: Mar. 27, 2017

Related U.S. Application Data

(60) Provisional application No. 62/383,985, filed on Sep. 6, 2016.

(51) Int. Cl.
| | |
|---|---|
| H05K 5/06 | (2006.01) |
| H05K 5/02 | (2006.01) |
| H04M 1/03 | (2006.01) |
| H04M 1/02 | (2006.01) |

(52) U.S. Cl.
CPC ............ H05K 5/068 (2013.01); H04M 1/026 (2013.01); H04M 1/035 (2013.01); H05K 5/0213 (2013.01)

(58) Field of Classification Search
CPC ..... H05K 5/068; H05K 5/0213; H04M 1/035; H04M 1/026
See application file for complete search history.

(56) References Cited

U.S. PATENT DOCUMENTS

| | | | | |
|---|---|---|---|---|
| 7,565,178 | B1* | 7/2009 | Sitachitt | H04M 1/035 379/430 |
| 8,432,325 | B2* | 4/2013 | Qi | H01Q 1/245 343/702 |
| 8,531,834 | B2* | 9/2013 | Rayner | H01H 13/06 277/644 |
| 2008/0248841 | A1* | 10/2008 | Foo | G06F 1/1626 455/575.1 |
| 2014/0079252 | A1* | 3/2014 | Klein | H04R 1/02 381/152 |

(Continued)

*Primary Examiner* — Hung V Ngo
(74) *Attorney, Agent, or Firm* — Dickinson Wright RLLP

(57) ABSTRACT

An electronic device having openings covered by a vent assembly is disclosed. The vent assembly may include multiple adhesive layers surrounding an air-permeable, liquid resistant membrane that allow air to flow into and/or out of the electronic device, while also preventing liquid ingress into the electronic device. The membrane may be supported by several structural elements. For example, the vent assembly includes an adhesive layer secured with the membrane, with the adhesive layer including a web region having multiple ribs that engage the membrane. Also, the vent assembly includes a mesh material that includes a porous region that receives a portion of the adhesive layer. Also, an additional vent assembly may cover an additional opening of the electronic device and provide protection for an operational component in the electronic device. The additional vent assembly may allow air into the additional opening for the operational component.

15 Claims, 7 Drawing Sheets

(56) References Cited

U.S. PATENT DOCUMENTS

| | | | | |
|---|---|---|---|---|
| 2014/0228081 A1* | 8/2014 | Chang | .................. | H04B 1/3888 |
| | | | | 455/575.8 |
| 2014/0235156 A1* | 8/2014 | Li | .......................... | G06F 1/203 |
| | | | | 454/184 |
| 2014/0339012 A1* | 11/2014 | Richardson | ............ | G10K 11/18 |
| | | | | 181/202 |
| 2014/0368994 A1* | 12/2014 | Lee | ...................... | G06F 1/1656 |
| | | | | 361/679.55 |
| 2015/0017905 A1* | 1/2015 | Li | ..................... | H05K 7/20136 |
| | | | | 454/184 |
| 2015/0334863 A1* | 11/2015 | Beer | .................... | H05K 5/0213 |
| | | | | 220/745 |
| 2017/0181303 A1* | 6/2017 | Li | .......................... | H05K 5/068 |
| 2018/0035204 A1* | 2/2018 | Park | ........................ | H04R 1/44 |

* cited by examiner

VENTING FEATURES OF A PORTABLE ELECTRONIC DEVICE

CROSS-REFERENCE TO RELATED APPLICATION(S)

This application claims the benefit of priority to U.S. Provisional Application No. 62/383,985, filed on Sep. 6, 2016, and titled "VENTING FEATURES OF A PORTABLE ELECTRONIC DEVICE," the disclosure of which is incorporated herein by reference in its entirety.

FIELD

The following description relates to an electronic device. In particular, the following description relates a vent that permits airflow while blocking liquid passage. When positioned near an opening, or through hole, of the electronic device, the vent provides the electronic device with water-resistant capabilities, while also allowing equalization of air pressure between air in the electronic device and external/ambient air pressure.

BACKGROUND

Electronic device can be modified to include waterproof capabilities. For example, the electronic device may include a perforated element that resists water attempting to enter an opening of the electronic device. The perforated element alone, however, is insufficient for countering forces provided not only by water but also from other components or tools applied to the perforated element during assembly of the electronic device.

Also, the electronic device may include a touch-sensitive display assembly that receives an input or command through a touch-sensitive surface. Further, in some instances, the amount of force applied to the touch-sensitive surface is measured and can be used by the electronic device. When the force is relatively high, both the touch-sensitive display and a protective cover glass may bow or bend, thereby reducing the internal volume of the electronic device, and thus, increasing air pressure within the electronic device. In these instances, the perforated element may not expel air fast enough, and the increased air pressure can affect other internal components, such as a speaker module, that rely in part upon (or open to) the internal volume of the electronic device. Also, during operation, the speaker module may cause the air pressure within the electronic device to vary. As a result, the perforated element is susceptible to vibration in accordance with the variable air pressure, causing unwanted acoustical energy (from the perforated element) emitted from the electronic device.

SUMMARY

In one aspect, an electronic device is described. The electronic device may include an enclosure that includes an internal volume. The enclosure may include a through hole that opens to the internal volume. The electronic device may further include an audio component disposed in the internal volume. The electronic device may further include a vent assembly positioned within the internal volume between the through hole and the audio component. The vent assembly may include a first adhesive layer having a first opening. The vent assembly may further include a membrane secured with the first adhesive layer and covering the through hole. The membrane may include a material that prevents liquid exposure to the audio component while permitting transmission of audible sound. The vent assembly may further include a second adhesive layer secured with the membrane and having a second opening aligned with the first opening. The vent assembly may further include a support layer secured with the second adhesive layer and having a support layer opening aligned with the second opening. In some instances, the membrane includes a material that allows air to enter and exit the internal volume via the through hole.

In another aspect, a vent assembly for preventing liquid ingress into a through hole of an electronic device is described. The vent assembly may include a first adhesive layer that secures with the electronic device, the first adhesive layer having an opening. The vent assembly may further include a membrane secured with the first adhesive layer and covering the opening and the through hole. The membrane may include a material that permits airflow through the membrane while preventing the liquid ingress. The vent assembly may further include a second adhesive layer secured with the membrane. The second adhesive layer may include a web region that supports the membrane.

In another aspect, a method for forming a vent assembly for preventing liquid ingress in an electronic device is described. The method may include securing a membrane with a first adhesive layer. The method may further include securing a second adhesive layer with the membrane such that the membrane is positioned between the first adhesive layer and the second adhesive layer. The method may further include securing a mesh material with the second adhesive layer such that the second adhesive layer is positioned between the membrane and the mesh material.

Other systems, methods, features and advantages of the embodiments will be, or will become, apparent to one of ordinary skill in the art upon examination of the following figures and detailed description. It is intended that all such additional systems, methods, features and advantages be included within this description and this summary, be within the scope of the embodiments, and be protected by the following claims.

BRIEF DESCRIPTION OF THE DRAWINGS

The disclosure will be readily understood by the following detailed description in conjunction with the accompanying drawings, wherein like reference numerals designate like structural elements, and in which.

Figure 1:
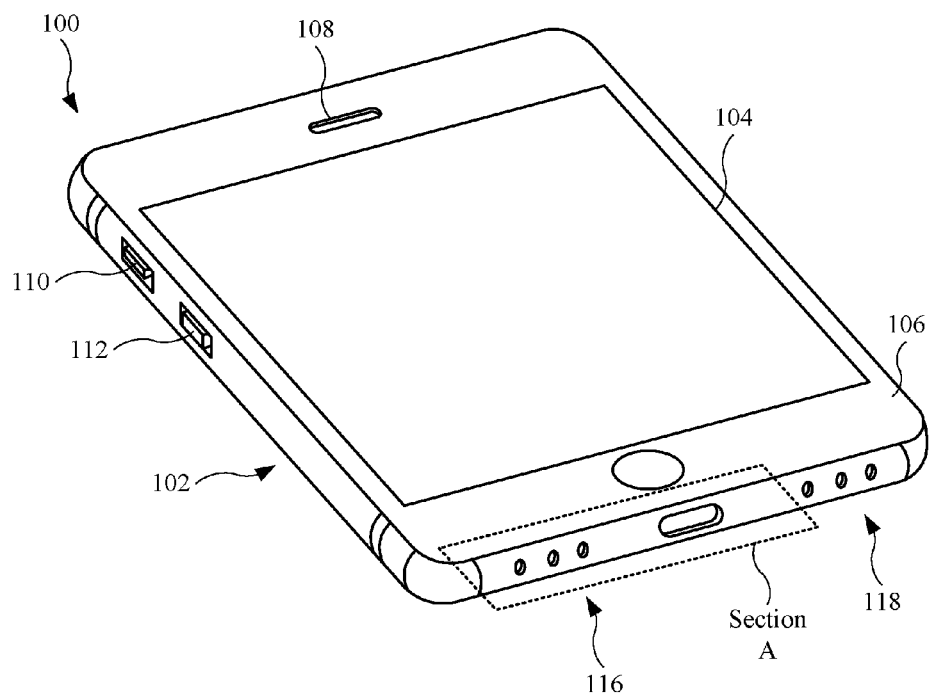
FIG. 1 illustrates an isometric view of an embodiment of an electronic device, in accordance with some described embodiments.

Those skilled in the art will appreciate and understand that, according to common practice, various features of the drawings discussed below are not necessarily drawn to scale, and that dimensions of various features and elements of the drawings may be expanded or reduced to more clearly illustrate the embodiments of the present invention described herein.

DETAILED DESCRIPTION

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting such that other embodiments may be used, and changes may be made without departing from the spirit and scope of the described embodiments.

The following disclosure relates to vent assemblies in an electronic device. A vent assembly may include one or more components that combine to prevent liquid ingress into the electronic device, while allowing air to pass into and/or out of the electronic device. In this regard, the electronic device may be modified, using one or more vent assemblies, to include water-resistant capabilities.

A vent assembly described herein may include an air-permeable, water-resistant membrane. Accordingly, the membrane may prevent penetration of water into the electronic device. However, in some instances, the force from water may cause some deformation to the membrane, particularly when the membrane is relatively thin. Moreover, during assembly of the electronic device, some components installed in the electronic device, or tooling associated with the installation, may engage the vent assembly and cause deformation to the membrane.

In order to protect the membrane from these forces, the vent assembly may include an adhesive layer and a mesh material that combine to surround the membrane. The adhesive layer may secure the vent assembly with the electronic device, while the mesh material provides support to the membrane.

The vent assembly may also include a second adhesive designed to provide additional support to the membrane. The second adhesive layer may include a web region that includes multiple ribs that structurally supporting the membrane, with adjacent ribs defining an opening that allows for airflow. Furthermore, the second adhesive layer may be positioned between the membrane and the mesh material. In this regard, the mesh material may include a porous region such that the second adhesive layer at least partially embeds in the porous region. When the second adhesive layer cures in the mesh material, the combination of the second adhesive layer and the mesh material not only provides structural support against liquids, but also provides support against varying air pressure inside the electronic device that otherwise cause the membrane to vibrate and generate unwanted acoustical energy.

In order to enhance the protective capabilities provided by the adhesive layer to the membrane, the vent assembly may include multiple adhesive layers. Moreover, the adhesive layer may include different material compositions to provide different functions. For example, some adhesive layers may include a relatively high bonding strength to maintain the vent assembly secured in a desired manner. Other adhesive layers may include a relatively high stiffness designed offset or counter shearing forces exerted on the membrane. Accordingly, the vent assembly may include different adhesive that serve different purposes.

The vent assemblies described herein may be used to allow air into and/or out of an internal volume defined by an enclosure, or housing, of the electronic device. Alternatively, or in combination, at least one of vent assemblies may be positioned between an opening (or openings) of the electronic device and an operational component (such as a microphone or a speaker module) located in the internal volume. In this manner, at least some of the vent assemblies provide protection against liquids entering the opening(s), while allowing airflow to and from the operational component. Also, the membranes described herein may be referred to as being "transparent" to audio transmission. In other words, a membrane may allow acoustical energy to pass through the material that forms the membrane in order to exit the electronic device (in the case of the membrane protecting a speaker) or to enter the electronic device (in the case of the membrane protecting a microphone).

These and other embodiments are discussed below with reference to FIGS. 1-10. However, those skilled in the art will readily appreciate that the detailed description given herein with respect to these Figures is for explanatory purposes only and should not be construed as limiting.

FIG. 1 illustrates an isometric view of an embodiment of an electronic device 100, in accordance with some described embodiments. In some embodiments, the electronic device 100 is a laptop computer device. In other embodiments, the electronic device 100 is a wearable electronic device designed to secure with an appendage (such as a wrist) of a user of the electronic device 100. In the embodiment shown in FIG. 1, the electronic device 100 is a consumer electronic device, such as a mobile wireless communication device that takes the form of, for example, a smartphone or a tablet computer device.

The electronic device 100 may include an enclosure 102 having several sidewalls and a rear (or bottom) wall that combine to define an internal volume that receives several internal components (not shown), such as a processor circuit, a memory circuit, an internal power supply, sensors, a microphone, and a speaker module, as non-limiting examples. The enclosure 102 may be formed from a metal, such as aluminum or an alloy that includes aluminum. However, other materials are possible, such as a rigid plastic or ceramic. Also, when the enclosure 102 is formed from a metal, the enclosure 102 may undergo an anodization process that immerses the enclosure 102 in an anodic bath with one or more acidic compounds. The anodization process is designed to provide an aesthetic finish to the enclosure 102 as well as improve the structural rigidity.

The electronic device 100 may further include a display assembly 104 designed to present visual information, such as video or still images, to a user of the electronic device 100. The display assembly 104 may include a touch-sensitive layer that includes capacitive touch-sensitive technology, designed to respond to a touch input to the display assembly. The display assembly 104 may respond to the touch input by changing the visual information presented on the display assembly 104. Furthermore, the input or command may depend in part upon an amount of force applied to the display assembly 104. For example, a touch input applying a small amount of force may correspond to a command different from a touch input applying a relatively larger amount of force.

The electronic device 100 may further include a protective layer 106 that covers the display assembly 104. Accordingly, a touch input event (described above) may also include a force applied to the protective layer 106. The protective layer 106 may include a transparent material, such as glass or sapphire. Also, the protective layer 106 may include an opening 108 through which an audio module (not shown) in the electronic device 100 emits acoustical energy in the form of audible sound. Although not shown, the electronic device 100 may include a frame that carries the protective layer 106. The frame is designed to couple or mate with the enclosure 102.

During a touch input event, the protective layer 106 may bend or bow in accordance with the amount of force applied to the protective layer 106. In this regard, the internal volume of the electronic device 100, defined in part by the enclosure 102 and the protective layer 106, may change based on the bending or bowing of the protective layer 106. As an example, applying a force to the protective layer 106 may bend the protective layer 106 in a direction toward the enclosure 102, thereby causing the internal volume of the electronic device 100 to decrease. The amount of bending, and in turn, the amount of volume decrease, is based upon the amount of force applied to the protective layer 106, and in turn, the display assembly 104. When the force is removed, the bending of the protective layer 106 and the display assembly 104 may cease, thereby causing the internal volume to increase as the protective layer 106 and the display assembly 104 returns to their original, unbent (flat) configuration.

The electronic device 100 may include external controls that provide an input or command to an internal component of the electronic device 100. For example, the electronic device 100 may include a switch 110 electrically coupled to a processor circuit (not shown) in the electronic device 100. The switch 110 may be actuated relative to the enclosure 102 in a direction toward or away from the protective layer 106. The electronic device 100 may further include a button 112 electrically coupled to the aforementioned processor circuit. The button 112 may be actuated relative to the enclosure 102 in a direction toward the enclosure 102.

The electronic device 100 may include additional openings, or through holes, formed in the enclosure 102 and used by some internal components for the electronic device 100. For example, the electronic device 100 may include a first set of openings 116 (or first set of through holes) formed in the enclosure 102, with at least some of the first set of openings 116 used to vent the electronic device 100. In other words, at least some of the first set of openings 116 may allow airflow into and/or out of the internal volume defined by the enclosure 102. Additionally, one opening of the first set of openings 116 may be used by an audio component, such as a microphone, to allow airflow into the electronic device 100. The electronic device 100 may further include a second set of openings (or second set of through holes) formed in the enclosure 102. The second set of openings 118 may allow acoustical energy generated from the electronic device 100 by a speaker module (not shown) to exit the electronic device 100. Also, one opening of the second set of openings 118 may be used by an additional audio component, such as an additional microphone, to allow airflow into the electronic device 100. While FIG. 1 shows the first set of openings 116 and the second set of openings 118 each having a discrete number of openings, additional openings are possible for either of the first set of openings 116 and/or the second set of openings 118.

Figure 2:
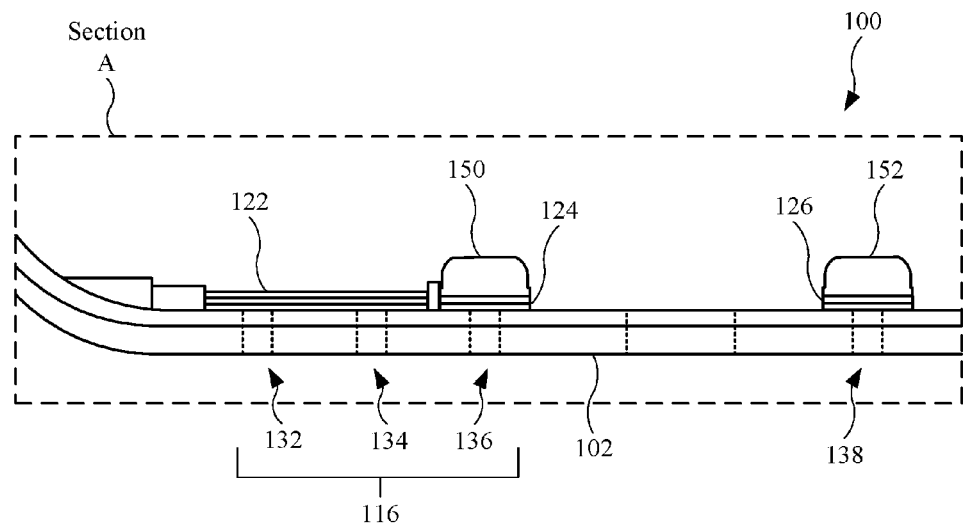
FIG. 2 illustrates a plan view of the electronic device taken along Section A in FIG. 1, with the protective layer and the display assembly removed to show several vent assemblies proximate to the openings of the electronic device.

FIG. 2 illustrates a plan view of the electronic device 100 taken along Section A in FIG. 1, with the protective layer 106 and the display assembly 104 removed to show several vent assemblies proximate to the openings of the enclosure 102. For purposes of illustration and simplicity, several additional components are removed. As shown, the first set of openings 116 may include a first opening 132 and a second opening 134, and a third opening 136, while the second set of openings 118 may include a first opening 138 as well as additional openings (not shown). The electronic device 100 may include a first vent assembly 122 covering the first opening 132 and the second opening 134, and a second vent assembly 124 covering the third opening 136. Also, the electronic device 100 may include a third vent assembly 126 covering the first opening 138. The aforementioned vent assemblies may be designed to prevent liquid entering one or more of the aforementioned openings from further entering into the electronic device 100, while also allowing airflow into the electronic device 100, as well as allowing airflow out of the electronic device 100. The various components, and their associated features, will be shown and described below.

When the electronic device 100 undergoes an elevation change, the external pressure (that is, air pressure outside the electronic device 100) changes. In order to equalize the pressure outside the electronic device 100 with pressure inside the electronic device 100, the first vent assembly 122 allows airflow into or out of the electronic device 100. For example, during a pressure increase outside the electronic device 100, airflow may enter the electronic device 100 by way of the then the first opening 132 and/or the second opening 134, and then the first vent assembly 122, causing the internal air pressure to increase and equalize with air pressure outside the electronic device 100. This may prevent the external pressure from damaging a component(s) of the electronic device 100. Conversely, during a pressure decrease outside the electronic device 100, airflow may exit the electronic device 100 by way of the first vent assembly 122, and then the first opening 132 and/or the second opening 134, causing the internal air pressure to decrease and equalize with air pressure outside the electronic device 100. This may prevent the electronic device 100 from expanding, which could otherwise cause the protective layer 106 to decouple from the enclosure 102 (both the protective layer 106 and the enclosure 102 are shown in FIG. 1).

The second vent assembly 124 and the third vent assembly 126 are positioned to allow air, but not liquids, into the third opening 136 and the first opening 138, respectively. Also, the second vent assembly 124 and the third vent assembly 126 may be used by a first operational component 150 and a second operational component 152, respectively, of the electronic device 100. In some embodiments, the first operational component 150 and the second operational component 152 include a first microphone and a second microphone, respectively. The operational components may include different acoustical components, such as speaker modules.

Figure 3:
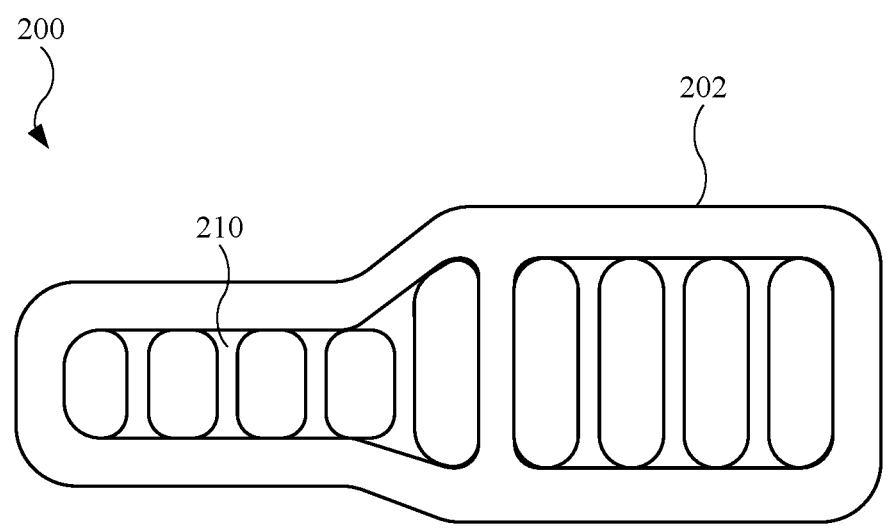
FIG. 3 illustrates a plan view of an embodiment of a vent assembly, in accordance with some described embodiments.

FIG. 3 illustrates a plan view of an embodiment of a vent assembly 200, in accordance with some described embodiments. The vent assembly 200 may be used in the electronic device 100 (shown in FIG. 1). In this regard, the first vent assembly 122 (shown in FIG. 2) may include any feature or features shown and described herein for the vent assembly 200.

The vent assembly 200 may include a first adhesive layer 202 designed to secure internal with the electronic device 100 along an internal surface of a sidewall of the enclosure 102 (shown in FIG. 2). Additional adhesive layers will be shown and described below. The vent assembly 200 may include a membrane 210 secured with (and behind) the first adhesive layer 202. The membrane 210 may include an air-permeable, liquid-resistant material, and will be described below.

As previously shown and described, the vent assembly 200 may include a size and shape to cover one or more openings of the enclosure 102 (shown in FIG. 1). Also, the vent assembly 200 may include a sufficiently large size and shape in order to allow airflow through the membrane 210. For example, air pressure within the electronic device 100 may increase during a touch input (representing a command input by a user) to the display assembly 104 (shown in FIG. 1). Moreover, air pressure within the electronic device 100 may fluctuate during use a speaker module (not shown) located in the electronic device 100. In this regard, the vent assembly 200, and in particular, the membrane 210, is selected to include a size and shape (that is, a surface area) sufficiently large enough to allow airflow to exit the electronic device 100 (shown in FIG. 1) when the display assembly 104 is depressed, and/or when the pressure fluctuates during use of the aforementioned speaker module.

Figure 4:
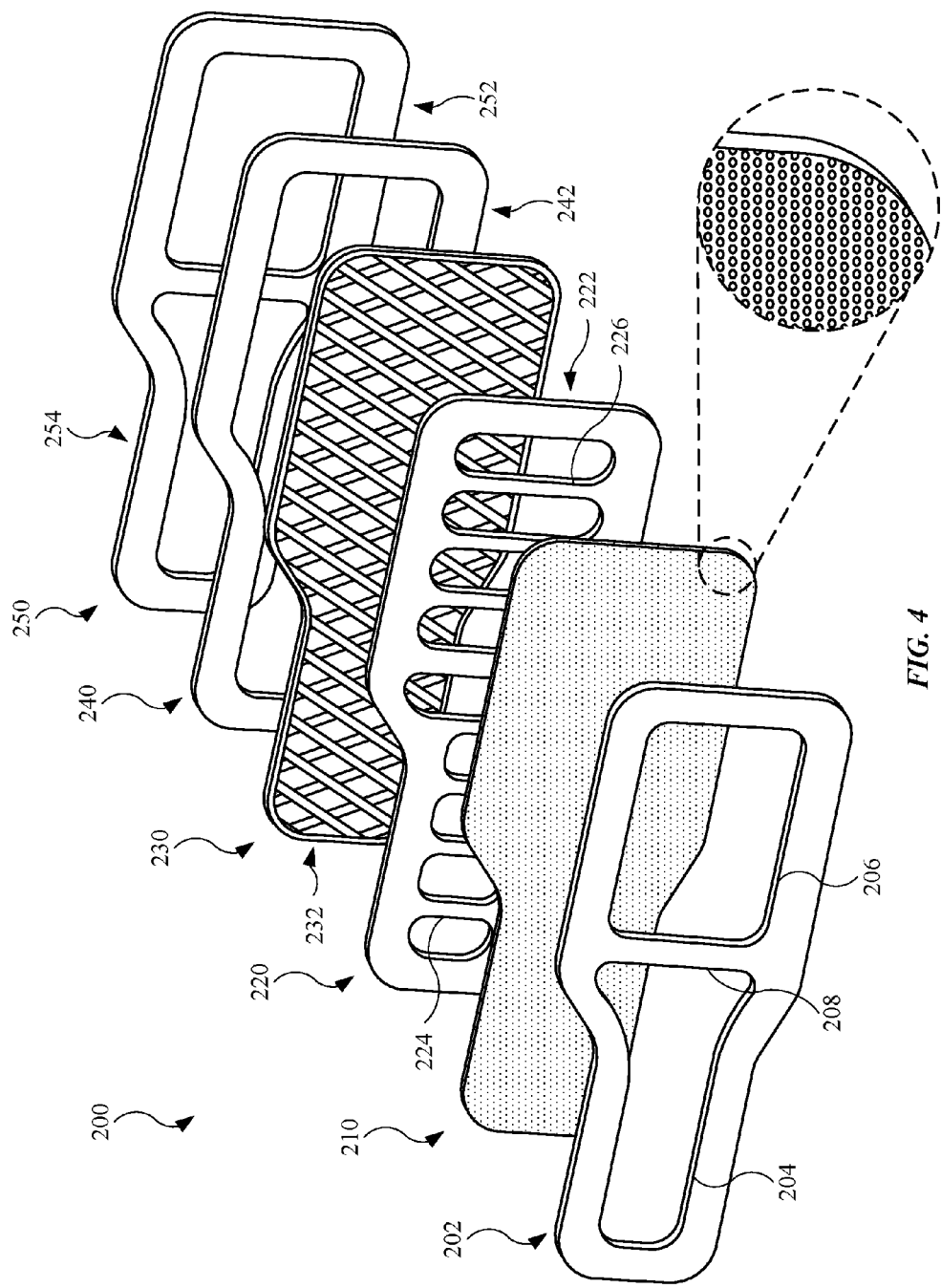
FIG. 4 illustrates an exploded view of the vent assembly shown in FIG. 3, showing various elements of the vent assembly.

FIG. 4 illustrates an exploded view of the vent assembly 200 shown in FIG. 3, showing various elements of the vent assembly 200. For example, the vent assembly 200 may include a first adhesive layer 202, as previously described. The first adhesive layer 202 may include a first opening 204 and a second opening 206 separated from first opening 204 by a rib 208. The first adhesive layer 202 may permit passage of airflow by way of the first opening 204 and the second opening 206, while the rib 208 provides structural support to the vent assembly 200.

The vent assembly 200 may further include a membrane 210, as previously described. The membrane 210 is positioned relative to the first adhesive layer 202 such that the first adhesive layer 202 adhesively secures with a first surface 212 of the membrane 210. The membrane 210 may include an air-permeable, liquid-resistant material. As shown in the enlarged view, the membrane 210 may include a material having small openings, or micro-openings. In some embodiments, the membrane 210 includes polytetrafluoroethylene ("PTFE"). Further, the PTFE material may include a stretched PTFE, formed in part by pulling on two opposing sides of the PTFE material in opposite directions. In this regard, when the material includes small openings, the stretching action may expand the small openings, thereby allowing airflow to pass through the material more quickly (due to the increase size and shape of the openings).

Accordingly, when a force is applied to the protective layer 106 and the display assembly 104 (both shown in FIG. 1), causing an internal volume decrease, and corresponding internal pressure increase, of the electronic device 100 (shown in FIG. 1), the membrane 210, having openings of increased dimensions, more readily allows air to pass out of the electronic device 100 so that the internal pressure of the electronic device 100 equalizes with external pressure outside the electronic device 100 before some (or all) of the internal components of the electronic device 100 are affected from any pressure change. In some embodiments, the membrane 210 includes a thickness of approximately 5 micrometers. Also, in order support the membrane 210, the membrane 210 may rely upon the rib 208 of the first adhesive layer 202. Also, while a specific material is described for the membrane 210, other air-permeable, liquid-resistant materials are possible.

The vent assembly 200 may further include a second adhesive layer 220 that secures to a second surface (not shown) of the membrane 210, with the second surface being opposite the first surface 212. Accordingly, the membrane 210 may be positioned between the first adhesive layer 202 and the second adhesive layer 220. In order to provide additional support to the membrane 210, the second adhesive layer 220 may include a web region 222 that includes several ribs. For example, the web region 222 may include a first rib 224 and a second rib 226. As shown, several additional ribs are possible. The ribs may engage the membrane 210 to provide structural support, while the openings between adjacent ribs permit airflow through the second adhesive layer 220.

The vent assembly 200 may further include a mesh material 230 that secures with the second adhesive layer 220. Accordingly, the second adhesive layer 220 may be positioned between the membrane 210 and the mesh material 230. The mesh material 230 may include a porous region 232. In some embodiments, the mesh material 230 includes an acoustic mesh. In this regard, the mesh material 230 may provide an acoustically transparent material that acts as a barrier to dust and water. Also, the porous region 232 may allow the second adhesive layer 220 to at least partially embed, or fill, in the mesh material 230. For example, the ribs of the second adhesive layer 220 may embed at corresponding locations of the mesh material 230. In this manner, when the embedded portion of the second adhesive layer 220 cures within the mesh material 230, the mesh material 230 provides additional support to the membrane 210.

The vent assembly 200 may include a third adhesive layer 240 secured with the mesh material 230, and may be adhesively secured with an additional component (not shown) in an electronic device (such as the electronic device 100, shown in FIG. 1). As shown, the mesh material 230 may be positioned between the second adhesive layer 220 and the third adhesive layer 240. Further, in some instances, a portion of the third adhesive layer 240 is embedded in the porous region 232 of the mesh material 230, in a manner similar to that of the second adhesive layer 220. Also, as shown, the third adhesive layer 240 includes an opening 242 that permits airflow through the third adhesive layer 240.

Optionally, the vent assembly 200 may include a support layer 250. In some embodiments, the support layer 250 includes a polyethylene terephthalate ("PET") material. However, the second adhesive layer 220 and the mesh material 230 may provide sufficient support to the membrane 210 without the support layer 250. As shown, the support layer 250 may include a first opening 252 and a second opening 254 that permit airflow through the support layer 250. When the vent assembly 200 includes the support layer 250, the support layer 250 may adhesively secure with the third adhesive layer 240.

Figure 5:
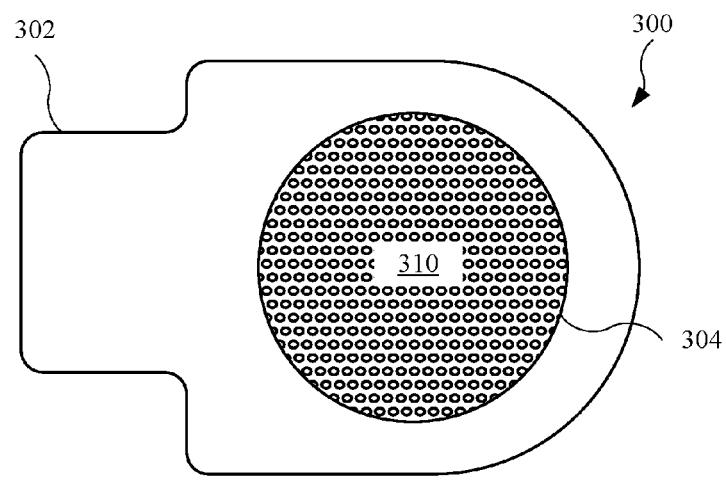
FIG. 5 illustrates a plan view of an alternate embodiment of a vent assembly, in accordance with some described embodiments.

FIG. 5 illustrates a plan view of an alternate embodiment of a vent assembly 300, in accordance with some described embodiments. The vent assembly 300 may be used in the electronic device 100 (shown in FIG. 1). In this regard, the second vent assembly 124 and the third vent assembly 126 (both shown in FIG. 2) may include any feature or features shown and described herein for the vent assembly 300.

The vent assembly 300 may include a first adhesive layer 302 designed to secure internal with the electronic device 100 along an internal wall of the enclosure 102 (shown in FIG. 2). Additional adhesive layers will be shown and described below. The first adhesive layer 302 may include an opening 304 that allows air to pass through the first adhesive layer 302 (at the opening 304. The vent assembly 300 may include a membrane 310 secured with the first adhesive layer 302. As shown, the membrane 310 may cover the opening 304. The membrane 310 may include an air-permeable, liquid-resistant material, and will be described below.

Figure 6:
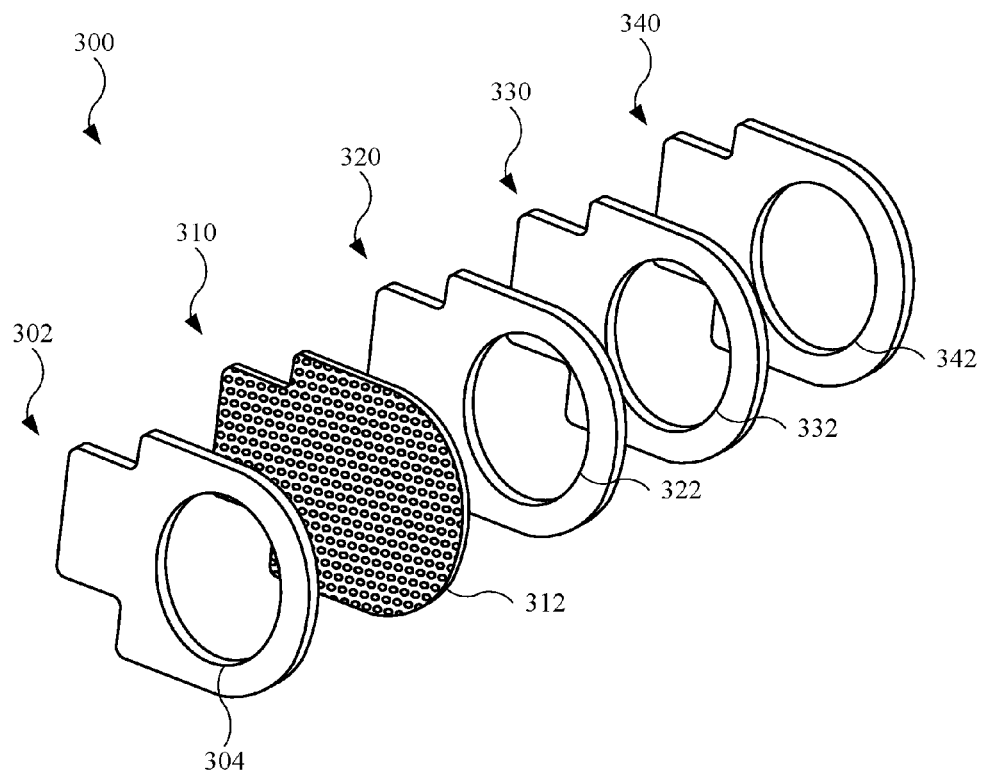
FIG. 6 illustrates an exploded view of the vent assembly shown in FIG. 5, showing various elements of the vent assembly.

FIG. 6 illustrates an exploded view of the vent assembly 300 shown in FIG. 5, showing various elements of the vent assembly. For example, the vent assembly 300 may include a first adhesive layer 302 having an opening 304, as previously described. The first adhesive layer 302 may include an opening 304. The vent assembly 300 may further include a membrane 310, as previously described. The membrane 310 may include an air-permeable, liquid-resistant material. Further, the membrane 310 may include any feature or features previously described for a membrane, such as the membrane 210 (shown in FIG. 4). Also, the first adhesive layer 302 may adhesively secure with a first surface 312 of the membrane 310.

The vent assembly 300 may further include a second adhesive layer 320 that secures to a second surface (not shown) of the membrane 310, with the second surface being opposite the first surface 312. Accordingly, the membrane 310 may be positioned between the first adhesive layer 302 and the second adhesive layer 320. The second adhesive layer 320 may permit airflow to pass by way of an opening 322.

The vent assembly 300 may further include a support layer 330. The support layer 330 may secure with the second adhesive layer 320. Accordingly, the second adhesive layer 320 may be positioned between the membrane 310 and the support layer 330. In some embodiments, the support layer 330 includes a PET material. The support layer 330 may permit airflow to pass by way of an opening 332.

The vent assembly 300 may include a third adhesive layer 340 secured with the support layer 330. The third adhesive layer 340 may adhesively secure with an additional component (not shown) in an electronic device. As shown, the support layer 330 may be positioned between the second adhesive layer 320 and the third adhesive layer 340. Also, the third adhesive layer 340 may permit airflow to pass by way of an opening 342. Although an exploded view is shown in FIG. 6, it should be noted that the vent assembly 300 may be assembled such that the aforementioned openings of the layers are aligned with one another. In this regard, the openings may be "aligned" by being concentric with one another, or at least partially overlapping one another. For example, the opening 304 of the first adhesive layer 302 may align with the opening 322 of the second adhesive layer 320. Also, the opening 322 of the second adhesive layer 320 may align with the opening 332 of the support layer 330, and the opening 332 of the support layer 330 may align with the opening 342 of the third adhesive layer 340.

The first adhesive layer 302 and the third adhesive layer 340, both on an outer perimeter of the vent assembly 300, may include a material (or materials) designed to provide enhanced adhesive strength, thereby increasing adhesive bonding of the vent assembly 300 with a component(s) secured with the first adhesive layer 302 and the third adhesive layer 340. Also, the first adhesive layer 302 and the third adhesive layer 340 may promote improved sealing capabilities. The second adhesive layer 320, which may be centrally located in the vent assembly 300, may provide the vent assembly 300 with enhanced stiffness or rigidity. In particular, the increased stiffness may provide the membrane 310 with increases support against shearing forces exerted on the membrane 310. This will be shown below. Accordingly, the vent assembly 300 may include different types of adhesives that provide different enhancements to the vent assembly 300 in addition to simply providing bonding capabilities. Also, based on the different functions and characteristics, the aforementioned adhesives may include different compositions, or material make-ups. In this regard, the first adhesive layer 302 and the third adhesive layer 340 may include a bonding strength greater than that of the second adhesive layer 320, while the second adhesive layer 320 may include a stiffness greater than that of the first adhesive layer 302 and the third adhesive layer 340.

Figure 7:
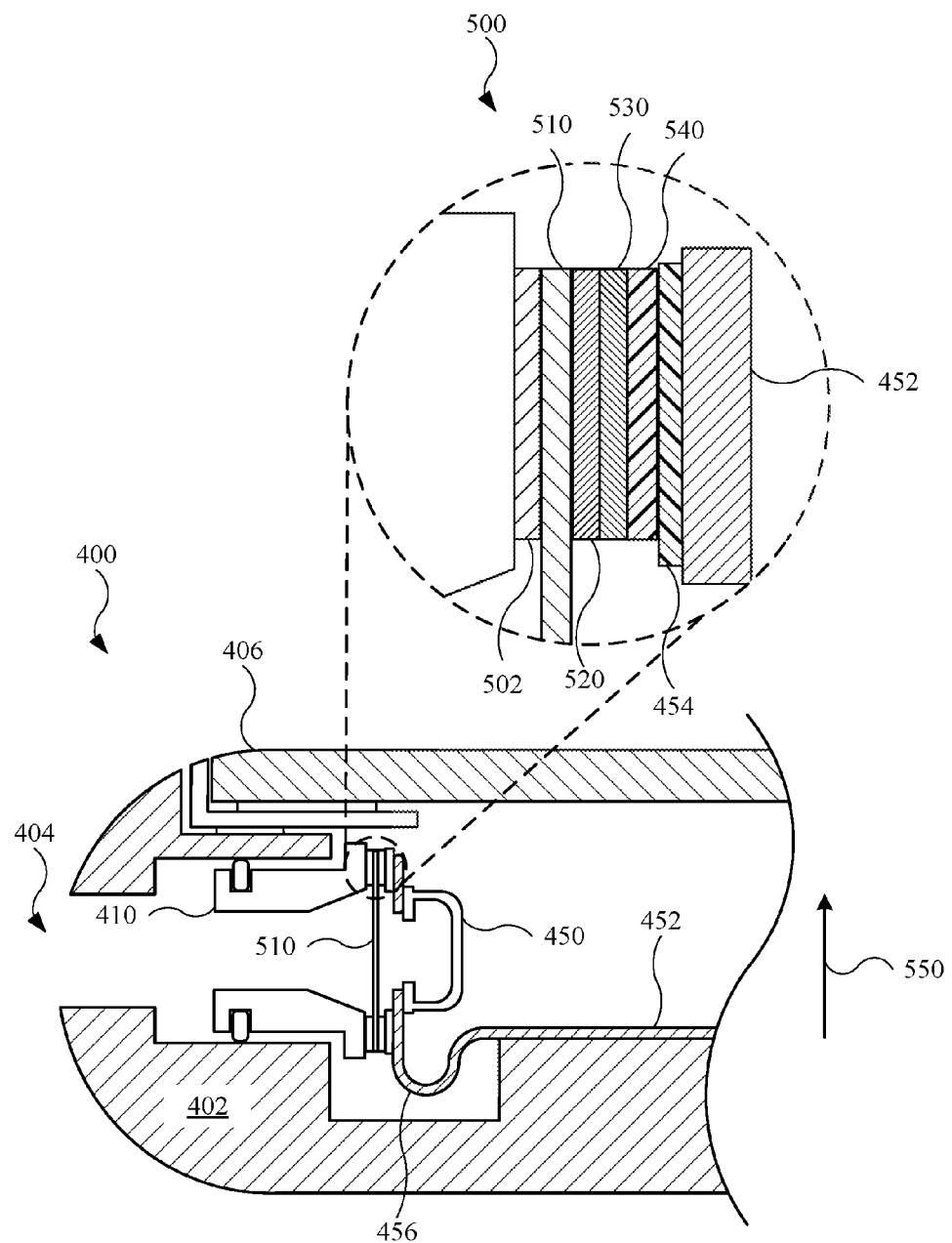
FIG. 7 illustrates a cross sectional view of an electronic device, showing an embodiment of a vent assembly installed in the electronic device, in accordance with some described embodiments.

FIG. 7 illustrates a cross sectional view of an electronic device 400, showing an embodiment of a vent assembly 500 installed in the electronic device 400, in accordance with some described embodiments. The electronic device 400 may include any feature(s) previously described for an electronic device. Also, the vent assembly 500 may include any feature(s) shown and described herein for the vent assembly 300 (shown in FIGS. 5 and 6). In this regard, as shown in the enlarged view, the vent assembly 500 may include a first adhesive layer 502, a membrane 510, a second adhesive layer 520, a support layer 530, and a third adhesive layer 540.

The electronic device 400 may include an enclosure 402 having an opening 404, or through hole. The electronic device 400 may include a bracket 410 aligned with the opening 404, and adhesively secured with the vent assembly 500 by the first adhesive layer 502. Also, as shown, the membrane 510 is positioned to block or cover the opening 404 internally within the electronic device 400. Also, the electronic device 400 may include an operational component 450. In some embodiments, the operational component 450 includes a microphone. As shown, the operational component 450 is secured and electrically connected with a circuit 452. The circuit 452 may include a flexible circuit designed to flex or bend to position the operational component 450 in a desired location. The circuit 452 may include a stiffening element 454 that secures with the vent assembly 500 by the third adhesive layer 540.

As shown, the circuit 452 includes a bend 456 such that the circuit 452 includes one region that oriented at, or approximately at, a 90-degree angle with respect to another region (of the circuit 452. Further, the bend 456 may cause an "upward" force in the direction of an arrow 550 and toward a protective layer 406, causing shearing forces that are exerted on the membrane 510. As denoted by the arrow 550, the shearing force is in a direction parallel with respect to the vent assembly 500 and its layers/components. However, the second adhesive layer 520 may include an enhanced stiffness that provides counterforce, or offsetting force, to the shearing forces, such that the membrane 510 is prevented from deformation, such as wrinkling, that may cause distortions in the membrane 510 that affect audio performance. The support layer 530 may also provide support, including structural support, to the second adhesive layer 520, and in turn, to the membrane 510. Also, the first adhesive layer 502 and the third adhesive layer 540 may bond with the bracket 410 and the stiffening element 454, respectively, providing enhanced bonds such that the vent assembly 500 remains intact in a desired location, even in response to shearing forces from the circuit 452.

Figure 8:
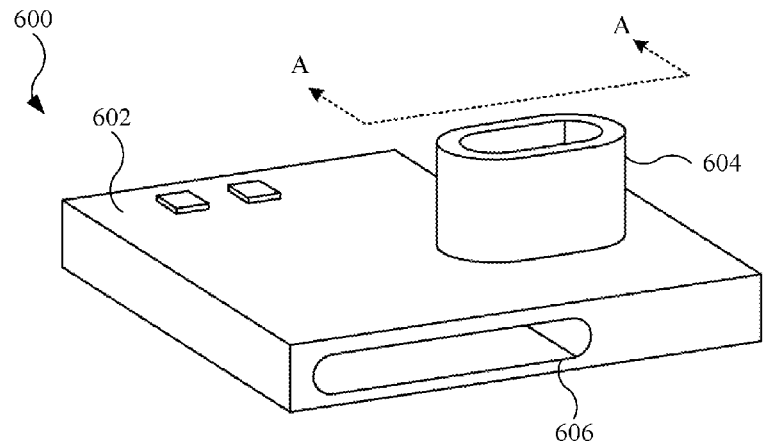
FIG. 8 illustrates an isometric view of an embodiment of an audio module, in accordance with some described embodiments.

FIG. 8 illustrates an isometric view of an embodiment of an audio module 600, in accordance with some described embodiments. The audio module 600 may be used by an electronic device (not shown) as a speaker module to generate acoustical energy in the form of audible sound. As shown, the audio module 600 may include a body 602 that defines an outer perimeter of the audio module 600 and houses several internal components (not shown) of the audio module 600. The body 602 may include an extension 604, or snout, that mates with another component (not shown). The acoustical energy generated from the audio module 600 may exit via the extension 604. The body 602 may further include an opening 606 that opens to a back volume (not shown) of the audio module 600. In this regard, the back volume of the audio module 600 may also open to the internal volume (defined in part by the protective layer 106 and the enclosure 102, both shown in FIG. 1) of the electronic device 100 (shown in FIG. 1) by way of the opening 606.

Figure 9:
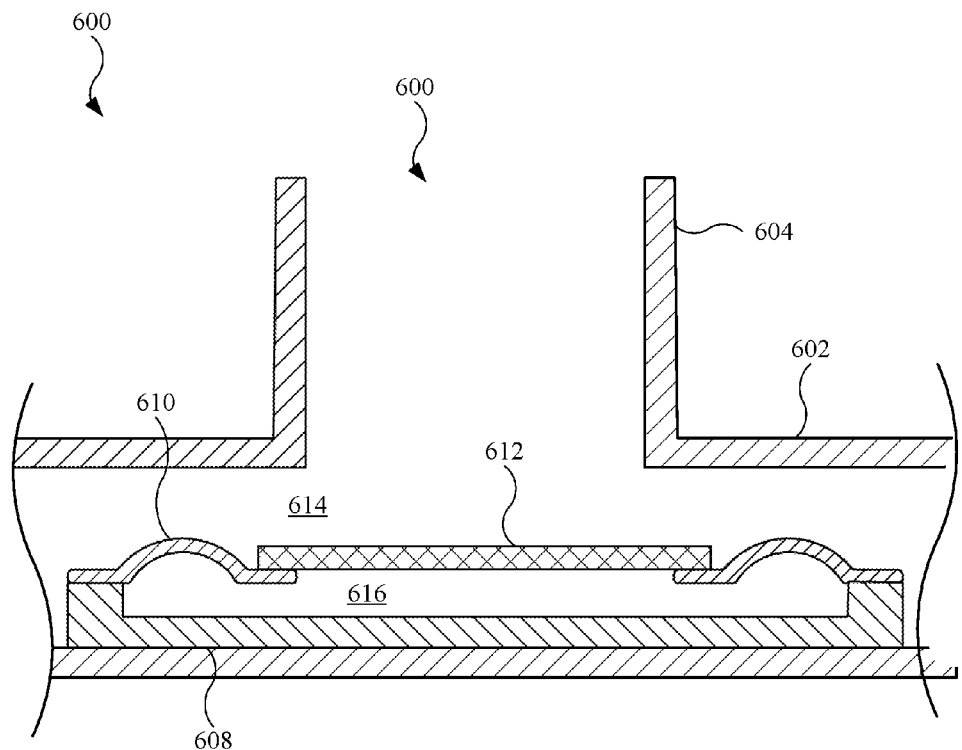
FIG. 9 illustrates a cross sectional view of the audio module shown in FIG. 8, taken along line A-A in FIGS. 8.

FIG. 9 illustrates a cross sectional view of the audio module 600 shown in FIG. 8, taken along line A-A in FIG. 8. As shown, the audio module 600 may include a suspension element 608 that holds a surround element 610. Also, the audio module 600 may include a membrane 612 secured with the surround element 610. In some embodiments, the membrane 612 includes a silicone membrane that is liquid-resistant. However, other liquid-resistant materials are possible. During operation, the audio module 600 is designed to provide electrical energy that causes the membrane 612, along with the surround element 610, to vibrate at various frequencies to produce acoustical energy in the form of audible sound.

The audio module 600 may further include a front volume 614 and a back volume 616 separated from the front volume 614 by the membrane 612. As previously described, the opening 606 may open to both the internal volume of the electronic device (not shown) and the back volume 616. As a result, any pressure increases in the internal volume may affect the acoustical performance of the audio module 600. For example, a pressure increase in the internal volume may increase the pressure in the back volume 616, and actuate the membrane 612 such that the membrane 612 contacts the body 602. This is generally undesirable, particularly when the audio module 600 is in use, as this may cause distortions in audio quality.

In order to prevent the membrane 612 from contacting the body 602, several modifications can be made. For example, the suspension element 608 can be tightened, or stiffened, to limit some vibrational movement of the surround element 610. Also, the membrane 612 may be increased in size to limit movement of the membrane 612. As shown, the membrane 612 includes a dimension greater than that of the extension 604.

Figure 10:
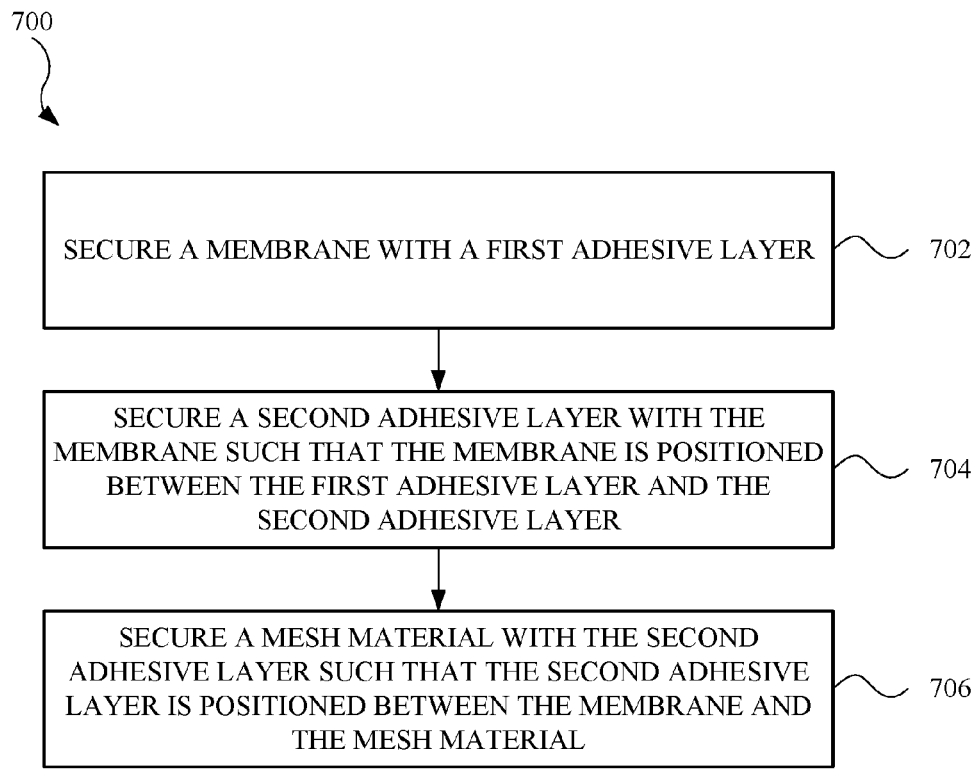
FIG. 10 illustrates a flowchart showing a method for forming a vent assembly for use in an electronic device, in accordance with some described embodiments.

FIG. 10 illustrates a flowchart 700 showing a method for forming a vent assembly for use in an electronic device, in accordance with some described embodiments. The vent assembly may be used to support a liquid-resistant electronic device by covering one or more openings of the electronic device, with the vent assembly allowing air, but not liquids, to pass into and/or out of the electronic device, thereby providing liquid ingress protection for an operational component of the electronic device. Also, the vent assembly may be used to vent the electronic device, allowing a liquid-resistant electronic device equalize internal air pressure with external (ambient) air pressure in an efficient manner.

In step 702, a membrane is secured with a first adhesive layer. The membrane may include an air-permeable, liquid resistant membrane. In this regard, the membrane may include PTFE, including stretched PTFE. The first adhesive layer may secure with the electronic device. Also, in some embodiments, the first adhesive layer includes an enhanced bonding strength. In this regard, the first adhesive layer may provide an enhanced seal with an enclosure of the electronic device, or a bracket installed in the electronic device. Also, the first adhesive layer may include an opening. Further, the first adhesive layer may include multiple openings separated by rib.

In step 704, a second adhesive layer is secured with the membrane such that the membrane is positioned between the first adhesive layer and the second adhesive layer. The second adhesive layer may include a web region having several ribs that provide structural support for the membrane. The second adhesive layer may also include openings between adjacent ribs. Also, in some instance, the second adhesive layer may provide an enhanced stiffing material to counter or offset shearing forces exerted on the membrane.

In step 706, a mesh material is secured with the second adhesive layer such that the second adhesive layer is positioned between the membrane and the mesh material. The mesh material may include an acoustic mesh. Further, the mesh material may include a porous region that receives a portion of the second adhesive layer.

Optionally, a support layer may be included. Also, a third adhesive layer may be secured with the mesh material (or the optional support layer). The porous region of the mesh material may receive a portion of the third adhesive layer.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings.

What is claimed is:

1. An electronic device having an enclosure that includes an internal volume, the enclosure having a through hole that opens to the internal volume, the electronic device comprising:
    an audio component disposed in the internal volume; and
    a vent assembly positioned within the internal volume between the through hole and the audio component, the vent assembly comprising:
        a first adhesive layer having a first opening,
        a membrane secured with the first adhesive layer and covering the through hole, the membrane having a material that prevents liquid exposure to the audio component while permitting transmission of audible sound, a second adhesive layer secured with the membrane and having a second opening aligned with the first opening, and a support layer secured with the second adhesive layer and having a support layer opening aligned with the second opening, wherein the membrane includes a material that allows air to enter and exit the internal volume via the through hole.

2. The electronic device of claim 1, further comprising:

a third adhesive layer having a third opening aligned with the support layer opening;

an operational component positioned in the internal volume; and a circuit secured with the third adhesive layer and electrically coupled with the operational component, wherein when the circuit provides a force to the vent assembly in a first direction, the second adhesive layer provides a counterforce in a second direction opposite the first direction.

3. The electronic device of claim 2, wherein the first adhesive layer includes a first stiffness, and wherein the second adhesive layer includes a second stiffness greater than the first stiffness.

4. The electronic device of claim 2, wherein the first adhesive layer includes a first adhesive strength, and wherein the second adhesive layer includes a second adhesive strength less than the first adhesive strength.

5. The electronic device of claim 2, wherein the operational component comprises a microphone.

6. The electronic device of claim 1, wherein the membrane comprises polytetrafluoroethylene.

7. The electronic device of claim 1, further comprising a bracket positioned in the enclosure and aligned with the through hole, the bracket adhesively secured with the vent assembly via the first adhesive layer.

8. The electronic device of claim 1, wherein the a second opening includes a size and shape in accordance with the first opening.

9. An electronic device, comprising:

an enclosure having a through hole; and a vent assembly carried by the enclosure, the vent assembly capable of preventing liquid ingress into the through hole, the vent assembly comprising:

a first adhesive layer that secures with the enclosure, the first adhesive layer having an opening, a membrane secured with the first adhesive layer and covering the opening and the through hole, the membrane having a material that permits airflow through the membrane while preventing the liquid ingress, and a second adhesive layer secured with the membrane, the second adhesive layer comprising a web region that supports the membrane.

10. The electronic device of claim 9, further comprising a mesh material that combines with the second adhesive layer, wherein the second adhesive layer includes:

a first surface adhesively secured with the membrane, and a second surface adhesively secured with the mesh material, the second surface opposite the first surface.

11. The electronic device of claim 10, wherein the mesh material comprises a porous region, and wherein the second adhesive layer is at least partially embedded in the porous region.

12. The electronic device of claim 9, wherein the web region comprises:

a first adhesive rib; and a second adhesive rib, wherein the first adhesive rib and the second adhesive rib define a second opening that allows the airflow, received by the membrane, to pass through the second adhesive layer.

13. The electronic device of claim 9, further comprising a third adhesive layer that secures with an additional component, wherein the mesh material includes:

a first surface adhesively secured with the second adhesive layer, and a second surface adhesively secured with the third adhesive layer, the second surface opposite the first surface.

14. The electronic device of claim 13, wherein the additional component comprises a support layer secured with the third adhesive layer.

15. The electronic device of claim 9, wherein the first adhesive layer further comprises:

a second opening; and a rib separating the opening from the second opening.

* * * * *